US012796573B2

(12) United States Patent
Müller et al.

(10) Patent No.: US 12,796,573 B2
(45) Date of Patent: Nov. 10, 2026

(54) SEMICONDUCTOR MODULE ARRANGEMENT

(71) Applicant: Infineon Technologies AG, Neubiberg (DE)

(72) Inventors: Christian Müller, Schweinfurt (DE); Andressa Colvero Schittler, Niederense (DE)

(73) Assignee: Infineon Technologies AG, Neubiberg (DE)

( * ) Notice: Subject to any disclaimer, the term of this patent is extended or adjusted under 35 U.S.C. 154(b) by 311 days.

(21) Appl. No.: 18/752,105

(22) Filed: Jun. 24, 2024

(65) Prior Publication Data

US 2024/0429150 A1 Dec. 26, 2024

(30) Foreign Application Priority Data

Jun. 23, 2023 (DE) ........................ 102023116599.2

(51) Int. Cl.
*H10W 90/00* (2026.01)
*H10W 70/685* (2026.01)
(Continued)

(52) U.S. Cl.
CPC ....... *H10W 90/401* (2026.01); *H10W 70/685* (2026.01); *H10W 90/701* (2026.01);
(Continued)

(58) Field of Classification Search
CPC .. H02M 1/0038; H02M 1/0048; H02M 7/003; H10W 70/60; H10W 70/685;
(Continued)

(56) References Cited

U.S. PATENT DOCUMENTS

2004/0113268 A1 6/2004 Shirakawa et al.
2013/0147540 A1 6/2013 Wu et al.
(Continued)

FOREIGN PATENT DOCUMENTS

DE 10316355 B3 7/2004
DE 102006004031 B3 3/2007
(Continued)

*Primary Examiner* — Cheung Lee
(74) *Attorney, Agent, or Firm* — Cooper Legal Group LLC

(57) ABSTRACT

A semiconductor module arrangement includes a first substrate with a first plurality of semiconductor bodies arranged thereon, a second substrate with a second plurality of semiconductor bodies arranged thereon, and a third substrate with a third plurality of semiconductor bodies arranged thereon. The first, second and third pluralities of semiconductor bodies together form a semiconductor arrangement, the semiconductor arrangement including a first node configured to be operatively coupled to a first electrical potential, and a second node configured to be operatively coupled to a second electrical potential that is different from the first electrical potential. A layout of the third substrate with the third plurality of semiconductor bodies arranged thereon equals a layout of the second substrate with the second plurality of semiconductor bodies arranged thereon. The first substrate is configured to be connected to the first node and the second node, and each of the second substrate and the third substrate is configured to be connected to a third node. A first current path extending between the first node and the third node via the first substrate and the second substrate provides identical voltage and current transfer characteristics as a second current path extending between the first node and the third node via the first substrate and the third substrate, and a third current path extending between the second node and the third node via the first substrate and the second substrate provides identical voltage and current transfer characteristics as a fourth current path extending between the second node and the third node via the first substrate and the third substrate.

20 Claims, 5 Drawing Sheets

(51) Int. Cl.
*H10W 70/692* (2026.01)
*H10W 72/00* (2026.01)
*H10W 74/10* (2026.01)

(52) U.S. Cl.
CPC ........ *H10W 70/692* (2026.01); *H10W 72/884* (2026.01); *H10W 74/10* (2026.01); *H10W 74/114* (2026.01); *H10W 90/00* (2026.01); *H10W 90/734* (2026.01); *H10W 90/754* (2026.01)

(58) Field of Classification Search
CPC . H10W 70/686; H10W 70/687; H10W 70/69; H10W 72/884; H10W 74/10; H10W 74/114; H10W 74/15; H10W 90/00; H10W 90/401; H10W 90/701; H10W 90/724; H10W 90/725; H10W 90/7295; H10W 90/734; H10W 90/754; H10W 90/755; H10W 90/764; H10W 90/765
See application file for complete search history.

(56) References Cited

U.S. PATENT DOCUMENTS

| | | | |
|---|---|---|---|
| 2016/0093589 | A1 | 3/2016 | Sato et al. |
| 2016/0191046 | A1 | 6/2016 | Zhao et al. |
| 2021/0043605 | A1 | 2/2021 | Mueller et al. |

FOREIGN PATENT DOCUMENTS

| | | | |
|---|---|---|---|
| DE | 112013001234 | T5 | 1/2015 |
| DE | 102020214607 | A1 | 5/2022 |
| EP | 3 955 290 | A1 | 2/2022 |

SEMICONDUCTOR MODULE ARRANGEMENT

RELATED APPLICATION

This application claims priority to German Patent Application No. 102023116599.2, filed on Jun. 23, 2023, entitled "SEMICONDUCTOR MODULE ARRANGEMENT", which is incorporated by reference herein in its entirety.

TECHNICAL FIELD

The instant disclosure relates to semiconductor module arrangements, in particular to semiconductor module arrangements comprising a plurality of separate substrates.

BACKGROUND

Power semiconductor module arrangements often include at least one semiconductor substrate arranged in a housing. A semiconductor arrangement including a plurality of controllable semiconductor elements (e.g., IGBTs, MOSFETs, HEMTs, etc.) is arranged on each of the at least one substrate. Each substrate usually comprises a substrate layer (e.g., a ceramic layer), a first metallization layer deposited on a first side of the substrate layer, and, optionally, a second metallization layer deposited on a second side of the substrate layer. The controllable semiconductor elements are mounted, for example, on the first metallization layer. The second metallization layer may optionally be attached to a base plate or heat sink. The layout of the semiconductor arrangement should be chosen to minimize the required size of the at least one substrate while, at the same time, preventing an unequal distribution of current densities, electrical losses, and thermal stress.

Hence, there is a general need for a power semiconductor module preventing an unequal distribution of current densities, electrical losses, and thermal stress.

SUMMARY

A semiconductor module arrangement includes a first substrate with a first plurality of semiconductor bodies arranged thereon, a second substrate with a second plurality of semiconductor bodies arranged thereon, and a third substrate with a third plurality of semiconductor bodies arranged thereon. The first, second and third pluralities of semiconductor bodies together form a semiconductor arrangement, the semiconductor arrangement including a first node configured to be operatively coupled to a first electrical potential, and a second node configured to be operatively coupled to a second electrical potential that is different from the first electrical potential. A layout of the third substrate with the third plurality of semiconductor bodies arranged thereon equals a layout of the second substrate with the second plurality of semiconductor bodies arranged thereon. The first substrate is configured to be connected to the first node and the second node, and each of the second substrate and the third substrate is configured to be connected to a third node. A first current path extending between the first node and the third node via the first substrate and the second substrate provides identical voltage and current transfer characteristics as a second current path extending between the first node and the third node via the first substrate and the third substrate, and a third current path extending between the second node and the third node via the first substrate and the second substrate provides identical voltage and current transfer characteristics as a fourth current path extending between the second node and the third node via the first substrate and the third substrate.

A semiconductor module arrangement includes a first semiconductor module arrangement and an identical second semiconductor module arrangement, wherein the first semiconductor module arrangement and the second semiconductor module arrangement are arranged next to each other in one plane and symmetrical about an axis of symmetry.

The disclosed subject matter may be better understood with reference to the following drawings and the description. The components in the figures are not necessarily to scale, emphasis instead being placed upon illustrating the principles of the disclosed subject matter. In the figures, like referenced numerals designate corresponding parts throughout the different views.

DETAILED DESCRIPTION

In the following detailed description, reference is made to the accompanying drawings. The drawings show specific examples in which the disclosed subject matter may be practiced. It is to be understood that the features and principles described with respect to the various examples may be combined with each other, unless specifically noted otherwise. As well as in the claims, designations of certain elements as "first element", "second element", "third element" etc. are not to be understood as enumerative. Instead, such designations serve solely to address different "elements". That is, for example, the existence of a "third element" does not require the existence of a "first element" and a "second element". An electrical line as described herein may be a single electrically conductive element, or include at least two individual electrically conductive elements connected in series and/or parallel. Electrical lines may include metal and/or semiconductor material, and may be permanently electrically conductive (i.e., non-switchable). An electrical line may have an electrical resistivity that is independent from the direction of a current flowing through it. A semiconductor body as described herein may be made of (doped) semiconductor material and may be a semiconductor chip or be included in a semiconductor chip. A semiconductor body has electrically connecting pads and includes at least one semiconductor element with electrodes. The pads are electrically connected to the electrodes which includes that the pads are the electrodes and vice versa.

Figure 1:
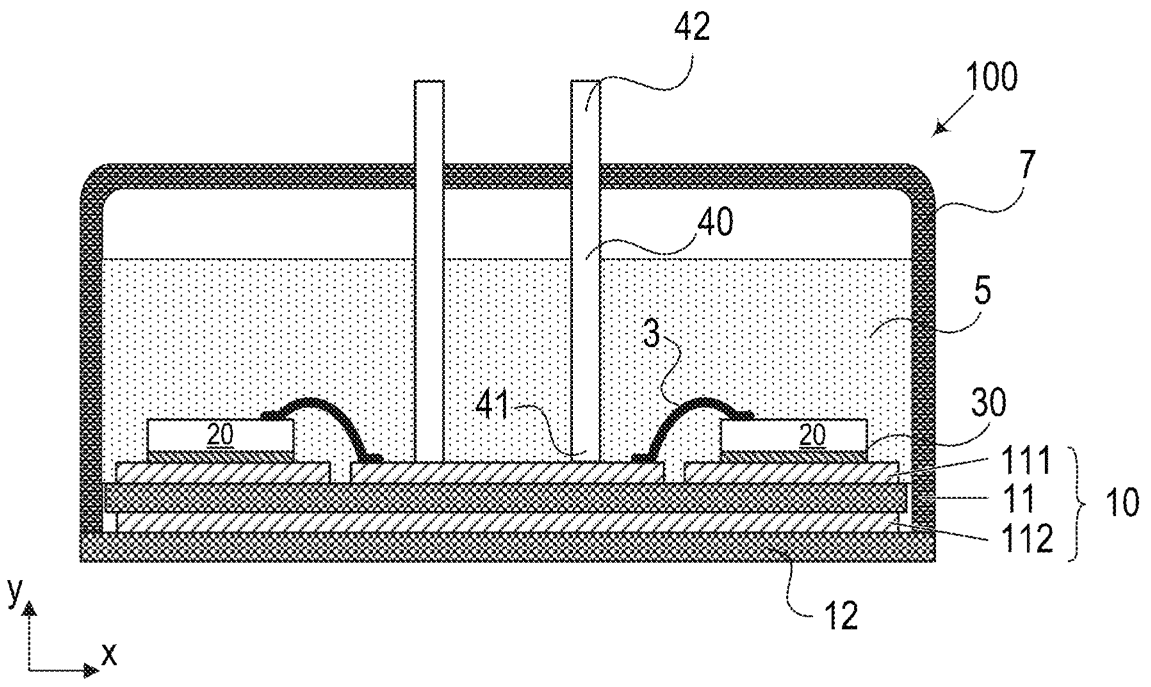
FIG. 1 is a cross-sectional view of a semiconductor module arrangement.

Referring to FIG. 1, a cross-sectional view of a power semiconductor module arrangement 100 is schematically illustrated. The power semiconductor module arrangement 100 includes a housing 7 and a substrate 10. The substrate 10 includes a dielectric insulation layer 11, a structured first metallization layer 111 attached to the dielectric insulation layer 11, and a (structured) second metallization layer 112 attached to the dielectric insulation layer 11. The dielectric insulation layer 11 is disposed between the first and second metallization layers 111, 112.

Each of the first and second metallization layers 111, 112 may consist of or include one of the following materials: copper; a copper alloy; aluminum; an aluminum alloy; any other metal or alloy that remains solid during the operation of the power semiconductor module arrangement. The substrate 10 may be a ceramic substrate, that is, a substrate in which the dielectric insulation layer 11 is a ceramic, such as, for example, a thin ceramic layer. The ceramic may consist of or include one of the following materials: aluminum oxide; aluminum nitride; zirconium oxide; silicon nitride; boron nitride; or any other dielectric ceramic. For example, the dielectric insulation layer 11 may consist of or include one of the following materials: $Al_2O_3$, AlN, SiC, BeO or $Si_3N_4$. For instance, the substrate 10 may, for example, be a Direct Copper Bonding (DCB) substrate, a Direct Aluminum Bonding (DAB) substrate, or an Active Metal Brazing (AMB) substrate. Further, the substrate 10 may be an Insulated Metal Substrate (IMS). An Insulated Metal Substrate generally comprises a dielectric insulation layer 11 comprising (filled) materials such as epoxy resin or polyimide, for example. The material of the dielectric insulation layer 11 may be filled with ceramic particles, for example. Such particles may comprise, for example, $SiO_2$, $Al_2O_3$, AlN, or BN and may have a diameter of between about 1 μm and about 50 μm. The substrate 10 may also be a conventional printed circuit board (PCB) having a non-ceramic dielectric insulation layer 11. For instance, a non-ceramic dielectric insulation layer 11 may consist of or include a cured resin.

The substrate 10 is arranged in a housing 7. In the example illustrated in FIG. 1, the substrate 10 is arranged on a base plate 12 which forms a ground surface of the housing 7, while the housing 7 itself solely comprises sidewalls and a cover. This, however, is only an example. It is also possible that the housing 7 further comprises a ground surface and the substrate 10 and the base plate 12 be arranged inside the housing 7. In some power semiconductor module arrangements 100, more than one substrate 10 is arranged on a single base plate 12 or on the ground surface of a housing 7. It is also possible that a substrate 10 itself forms a ground surface of the housing 7.

One or more semiconductor bodies 20 may be arranged on the at least one substrate 10. Each of the semiconductor bodies 20 arranged on the at least one substrate 10 may include a diode, an IGBT (Insulated-Gate Bipolar Transistor), a MOSFET (Metal-Oxide-Semiconductor Field-Effect Transistor), a JFET (Junction Field-Effect Transistor), a HEMT (High-Electron-Mobility Transistor), and/or any other suitable semiconductor element.

The one or more semiconductor bodies 20 may form a semiconductor arrangement on the substrate 10. In FIG. 1, only two semiconductor bodies 20 are exemplarily illustrated. The second metallization layer 112 of the substrate 10 in FIG. 1 is a continuous layer. The first metallization layer 111 is a structured layer in the example illustrated in FIG. 1. "Structured layer" means that the first metallization layer 111 is not a continuous layer, but includes recesses between different sections of the layer. Such recesses are schematically illustrated in FIG. 1. The first metallization layer 111 in this example includes three different sections. This, however, is only an example. Any other number of sections is possible. Different semiconductor bodies 20 may be mounted to the same or to different sections of the first metallization layer 111. Different sections of the first metallization layer 111 may have no electrical connection or may be electrically connected to one or more other sections using electrical connection elements 3 such as, for example, bonding wires or bonding ribbons. Electrical connections 3 may also include connection plates, conductor rails, or connection clips, for example, to name just a few examples. The one or more semiconductor bodies 20 may be electrically and mechanically connected to the substrate 10 by an electrically conductive connection layer 30. Such an electrically conductive connection layer 30 may be a solder layer, a layer of an electrically conductive adhesive, or a layer of a sintered metal powder, such as, for example, a sintered silver powder, for example. According to other examples, it is also possible that the second metallization layer 112 is a structured layer. It is further possible to omit the second metallization layer 112 altogether.

The substrate 10 may also be implemented as a multilayered substrate (not specifically illustrated) having more than one dielectric insulation layer 11 and at least one metallization layer arranged between two respective dielectric insulation layers, which may be referred to as "buried metallization layer". For example, by providing an additional dielectric insulation layer between the second metallization layer 112 and the base plate 12, the second metallization layer 112 would become a buried metallization in this sense. The at least one buried metallization layer may also be structured, as described with respect to the first metallization layer 111. An electrical contact to the respective buried metallization layer (between different metallization layers of the multilayered substrate) may be established by one or more so-called "vias", which are electrically conductive connections extending through a dielectric insulation layer arranged next to the respective buried metallization layer and to another metallization layer, which may be the first, second or a further buried metallization layer. The respective buried metallization layer, or at least a section of the buried metallization layer, may be used to transfer electric currents or signals. For example, the respective buried metallization layer may be used in a similar way as bonding wires to connect different nodes and/or circuit elements arranged on the substrate. In other words, connection elements 3 may also be formed by or may include a section of a buried metallization layer (a section of an additional metallization layer) of a multilayered substrate contacted by corresponding vias. Thus, a multilayered substrate may be used to replace some or all superficial connection elements, and/or it may be used to achieve a higher interconnection complexity between circuit nodes.

The power semiconductor module arrangement 100 illustrated in FIG. 1 further includes terminal elements 40. The terminal elements 40 are electrically connected to the first metallization layer 111 and provide an electrical connection between the inside and the outside of the housing 7. The terminal elements 40 may be electrically connected to the first metallization layer 111 with a first end 41, while a second end 42 of each of the terminal elements 40 protrudes out of the housing 7. The terminal elements 40 may be electrically contacted from the outside at their respective second ends 42. A first part of the terminal elements 40 may extend through the inside of the housing 7 in a vertical direction y. The vertical direction y is a direction perpendicular to a top surface of the substrate 10, wherein the top surface of the substrate 10 is a surface on which the at least one semiconductor body 20 is mounted. The terminal elements 40 illustrated in FIG. 1, however, are only examples. Terminal elements 40 may be implemented in any other way and may be arranged anywhere within the housing 7. For example, one or more terminal elements 40 may be arranged close to or adjacent to the sidewalls of the housing 7. Terminal elements 40 could also protrude through the sidewalls of the housing 7 instead of through the cover. The first end 41 of a terminal element 40 may be electrically and mechanically connected to the substrate 10 in any suitable way, such as, for example, by means of a welded joint or by means of an electrically conductive connection layer, for example (not explicitly illustrated in FIG. 1). Such an electrically conductive connection layer may be a solder layer, a layer of an electrically conductive adhesive, or a layer of a sintered metal powder, such as, for example, a sintered silver (Ag) powder, for example. The first end 41 of a terminal element 40 may also be electrically coupled to the substrate 10 via one or more electrical connections 3, for example.

The power semiconductor module arrangement 100 may further include an encapsulant 5. Encapsulant 5 may consist of or include a silicone gel or may be a rigid molding compound, for example. The encapsulant 5 may at least partly fill the interior of the housing 7, thereby covering the components and electrical connections that are arranged on the substrate 10. The terminal elements 40 may be partly embedded in the encapsulant 5. At least their second ends 42, however, are not covered by the encapsulant 5 and protrude from the encapsulant 5 through the housing 7 to the outside of the housing 7. The encapsulant 5 is configured to protect the components and electrical connections of the power semiconductor module 100, in particular the components arranged on the substrate 10 inside the housing 7, from certain environmental conditions and mechanical damage.

The layout of a semiconductor arrangement (e.g., different sections of the first metallization layer 111, semiconductor bodies 20, electrical connections 3, terminal elements 40, etc.) generally may be chosen to minimize the required size of each of the at least one substrate while, at the same time, also minimizing an unequal distribution of current densities, electrical losses, and thermal stress. Symmetry with respect to gate driving and parasitic inductances can be of high importance to achieve superior performance of the semiconductor module arrangement. In semiconductor module arrangements comprising more than one substrate 10, considerations concerning symmetry and heat distribution are often crucial.

Figure 2:
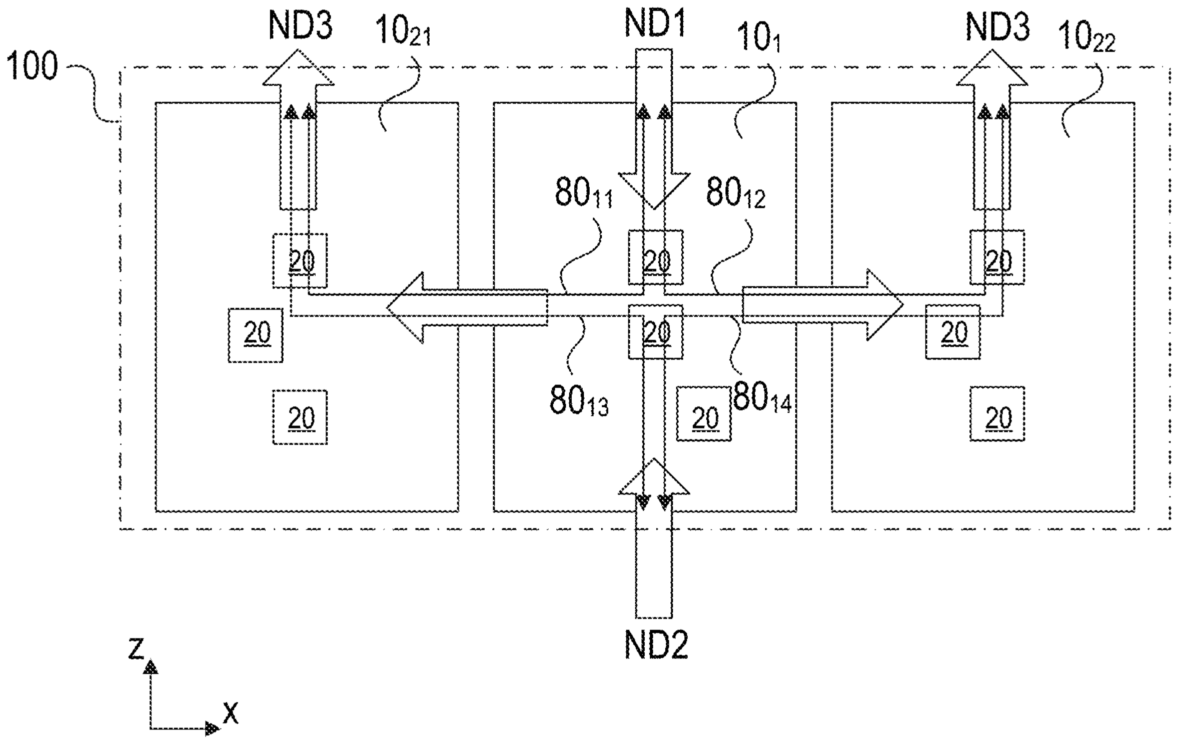
FIG. 2 is a schematic top view of a semiconductor module arrangement according to embodiments of the disclosure.

Semiconductor module arrangements according to embodiments of the disclosure provide highly symmetrical current flows, low parasitic inductances and, at the same time, a satisfying thermal performance (heat distribution). Now referring to FIG. 2, a semiconductor module arrangement according to embodiments of the disclosure comprises a first substrate $\mathbf{10}_1$ with a first plurality of semiconductor bodies 20 arranged thereon, a second substrate $\mathbf{10}_{21}$ with a second plurality of semiconductor bodies 20 arranged thereon, and a third substrate $\mathbf{10}_{22}$ with a third plurality of semiconductor bodies 20 arranged thereon. The first, second and third pluralities of semiconductor bodies 20 together form a semiconductor arrangement, the semiconductor arrangement comprising a first node ND1 configured to be operatively coupled to a first electrical potential, and a second node ND2 configured to be operatively coupled to a second electrical potential that is different from the first electrical potential A layout of the third substrate $\mathbf{10}_{22}$ with the third plurality of semiconductor bodies 20 arranged thereon equals a layout of the second substrate $\mathbf{10}_{21}$ with the second plurality of semiconductor bodies 20 arranged thereon. The layout of the third substrate $\mathbf{10}_{22}$ being equal to the layout of the second substrate $\mathbf{10}_{21}$ generally means that the arrangement, size, shape, material, etc. of, for example, the different sections of the first metallization layer 111, the semiconductor bodies 20, the electrical connections 3, the terminal elements 40, and any other elements arranged on the respective substrates are essentially the same (essentially identical). That is, the second substrate $\mathbf{10}_{21}$ may be readily replaced by the third substrate $\mathbf{10}_{22}$ and vice versa, without affecting the electrical properties and the function of the semiconductor module arrangement.

According to some embodiments of the disclosure, the first substrate 101, the second substrate $\mathbf{10}_{21}$ and the third substrate $\mathbf{10}_{22}$ are arranged next to each other in one plane, with the first substrate $\mathbf{10}_1$ arranged in between the second substrate $\mathbf{10}_{21}$ and the third substrate $\mathbf{10}_{22}$. This means, for example, that the three substrates are arranged on an essentially same level or height in a vertical direction perpendicular to the plane in which the three substrates are arranged. Thus, a cooling of the substrates using a heat sink with a flat contact surface may be facilitate. The substrates may also be arranged on the backplate 12, which may have a planar surface.

The terms "equal", "the same" or "identical" as used herein should be construed such that the related properties of different entities are very similar. It may also be said that the different entities may be designed such that the related properties are exactly the same, but slight deviations may occur based on manufacturing tolerances. Manufacturing tolerances may vary between different applications and different manufacturing processes used to produce the different entities.

The first substrate $\mathbf{10}_1$ is configured to be connected to the first node ND1 and the second node ND2, and each of the second substrate $\mathbf{10}_{21}$ and the third substrate $\mathbf{10}_{22}$ is configured to be connected to a third node ND3. A first current path $\mathbf{80}_{11}$ extending between the first node ND1 and the third node ND3 via the first substrate $\mathbf{10}_1$ and the second substrate $\mathbf{10}_{21}$ provides identical voltage and current transfer characteristics as a second current path $\mathbf{80}_{12}$ extending between the first node ND1 and the third node ND3 via the first substrate $\mathbf{10}_1$ and the third substrate $\mathbf{10}_{22}$, and a third current path $\mathbf{80}_{13}$ extending between the second node ND2 and the third node ND3 via the first substrate $\mathbf{10}_1$ and the second substrate $\mathbf{10}_{21}$ provides identical voltage and current transfer characteristics as a fourth current path $\mathbf{80}_{14}$ extending between the second node ND2 and the third node ND3 via the first substrate $\mathbf{10}_1$ and the third substrate $\mathbf{10}_{22}$.

That is, the first current path $\mathbf{80}_{11}$ and the second current path $\mathbf{80}_{12}$ may exhibit at least one of essentially identical or identical ohmic behaviors, essentially identical or identical inductive behaviors, and essentially identical or identical capacitive behaviors, for example. That is, a sum of the impedances of the different elements of the first current path $\mathbf{80}_{11}$ (total impedance of the first current path $\mathbf{80}_{11}$) may be (essentially) identical to a sum of the impedances of the different elements of the second current path $\mathbf{80}_{12}$ (total impedance of the second current path $80_{12}$). The same applies for the third current path $80_{13}$ and the fourth current path $80_{14}$. Elements of the current paths are, for example, the semiconductor bodies 20, respective sections of the first metallization layer 111, and connection elements which together form the respective current path.

According to one embodiment of the disclosure, the semiconductor bodies 20 of the first plurality of semiconductor bodies 20 may be slow switching semiconductor bodies, and the semiconductor bodies 20 of the second plurality of semiconductor bodies 20 and the semiconductor bodies 20 of the third plurality of semiconductor bodies 20 may be fast switching semiconductor bodies. A fast switching semiconductor body generally is a semiconductor body that may perform a switching operation (e.g., from a conducting state/on-state to a non-conducting state/off-state or vice versa) at a certain speed, such as, for example, faster than a defined threshold speed. A slow switching semiconductor body generally is a semiconductor body that may perform a switching operation (e.g., from a conducting state/on-state to a non-conducting state/off-state or vice versa) slower than the defined threshold speed. According to one example, semiconductor bodies 20 that, during operation, are switched with a high switching frequency (higher than a defined threshold frequency) may be implemented as fast switching devices. Any other semiconductor bodies 20 which, during operation, are switched with a low switching frequency (lower than the defined threshold frequency), such as, for example, grid frequency, may be implemented as slow switching devices, for example. Generally, each semiconductor body 20, during operation, generates switching losses as well as conduction losses. According to one example, semiconductor bodies that, during operation, generate more switching losses than conduction losses, may be implemented as fast switching devices. Any other semiconductor bodies 20 which, during operation generate more conduction losses than switching losses may be implemented as slow switching devices, for example.

By arranging fast switching semiconductor bodies 20 on the second substrate $10_{21}$ and on the third substrate $10_{22}$, and slow switching semiconductor bodies 20 on the first substrate 101, a majority of heat is generated on the second substrate $10_{21}$ and on the third substrate $10_{22}$. The second substrate $10_{21}$ and the third substrate $10_{22}$, therefore, will heat up more than the first substrate $10_1$ during operation of the semiconductor module arrangement, and thus form the hottest parts of the semiconductor module arrangement. A distance between the hottest parts is maximized by arranging the first substrate $10_1$ with slow switching semiconductor bodies 20 arranged thereon between the second substrate $10_{21}$ and the third substrate $10_{22}$. Such an arrangement may be cooled very efficiently, which will be described in further detail with respect to FIGS. 8 and 9 further below.

According to embodiments of this disclosure, a substrate material and/or substrate thickness used for the first, second and third substrates may be identical or different. For example, a substrate material used for the first substrate that may carry slow switching semiconductor bodies 20 may have a lower thermal conductivity than a substrate material used for the second and third substrate, that may carry fast switching semiconductor bodies. Similarly, a substrate thickness may be different between the first and the second and third substrates. Thinner substrates and materials with lower thermal conductivity may be cheaper and/or easier to process and thus in this case a total cost of the semiconductor module arrangement may be reduced.

According to further embodiments of this disclosure, the first, second and third substrates may be integrated in a structured multilayer substrate, such as an insulated metal substrate, where each of the first, second and third substrate are provided as areas of the structured multilayer substrate.

The semiconductor arrangement formed by the first, second, and third plurality of semiconductor bodies 20 may comprise an input stage IPS and an output stage OPS. The input stage IPS may be formed by the first plurality of semiconductor bodies 20. The second plurality of semiconductor bodies 20 may form a first output sub-stage OPS1, and the third plurality of semiconductor bodies 20 may form an identical second output sub-stage OPS2. The first output sub-stage OPS1 and the second output sub-stage OPS2 can be operated in parallel or separately. This will be explained in further detail by means of FIG. 5 in the following.

Figure 5:
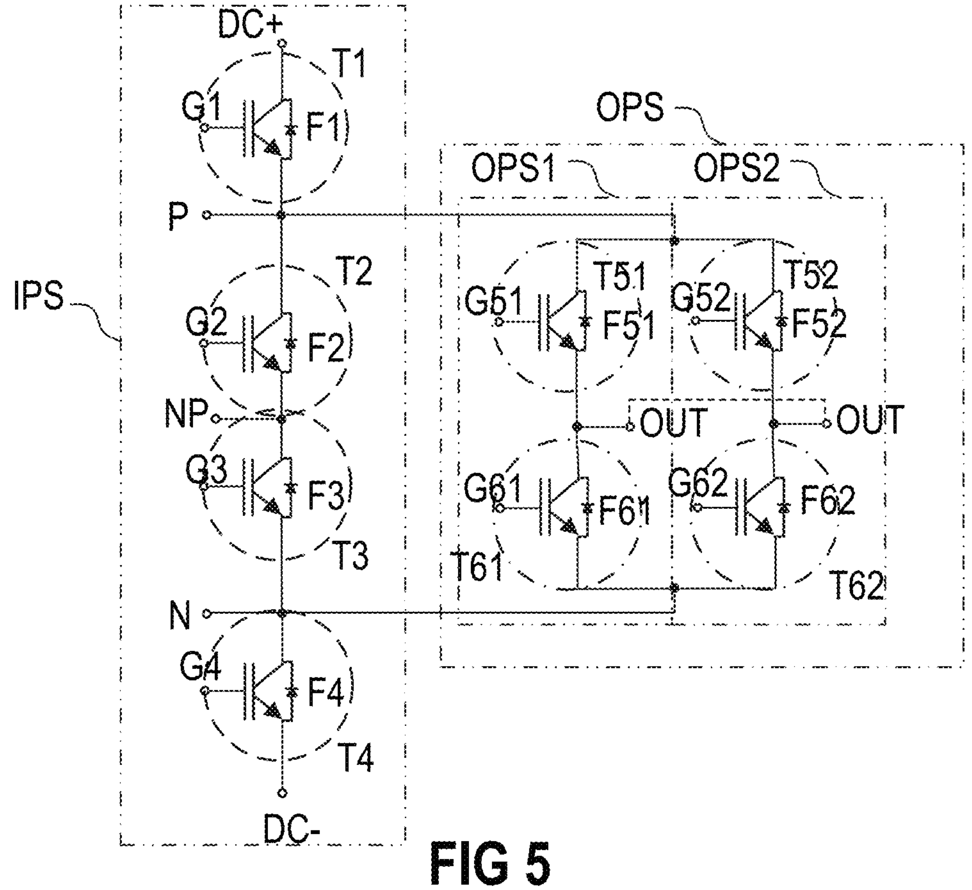
FIG. 5 is a circuit diagram of a semiconductor arrangement according to one example.

FIG. 5 is a circuit diagram of a semiconductor arrangement according to one example. The semiconductor arrangement of FIG. 5 may include and may be operated in the way of an ANPC (Active Neutral-Point Clamped) topology. The semiconductor arrangement in FIG. 5 includes a first node ND1 (e.g., first supply node DC+) which is configured to be operatively connected to a first electrical potential. The semiconductor arrangement further includes a second node ND2 (e.g., second supply node DC−) which is configured to be operatively connected to a second electrical potential. A fourth node NP is configured to be operatively connected to a third electrical potential. When the semiconductor arrangement is used as intended, the first potential is positive with reference to the third potential and the second potential is negative with reference to the third potential.

The arrangement further includes a first controllable semiconductor element T1 and a second controllable semiconductor element T2. Each of the first controllable semiconductor element T1 and the second controllable semiconductor element T2 includes a control electrode G1, G2 and a controllable load path between a first load electrode and a second load electrode. The first and the second controllable semiconductor element T1, T2 are connected with each other such that their respective load paths form a series connection between the first node ND1 and the fourth node NP. The arrangement further includes a third controllable semiconductor element T3 and a fourth controllable semiconductor element T4. Each of the third controllable semiconductor element T3 and the fourth controllable semiconductor element T4 includes a control electrode G3, G4 and a controllable load path between a first load electrode and a second load electrode. The third and the fourth controllable semiconductor element T3, T4 are connected with each other such that their respective load paths form a series connection between the fourth node NP and the second node ND2. The first controllable semiconductor element T1 and the second controllable semiconductor element T2 are connected with each other via a first common node P, and the third controllable semiconductor element T3 and the fourth controllable semiconductor element T4 are connected with each other via a second common node N.

The arrangement further includes a fifth controllable semiconductor element T51 having a control electrode G51 and a controllable load path between two load electrodes, the load path being operatively connected between the first common node P and a third node ND3 (e.g., output node OUT), and a sixth controllable semiconductor element T61 having a control electrode G61 and a controllable load path between two load electrodes, the load path being operatively connected between the third node ND3 and the second common node N. The fifth and the sixth controllable semiconductor element T51, T61 are connected with each other such that their respective load paths form a series connection between the first common node P and the second common node N.

The arrangement further includes a seventh controllable semiconductor element T52 and an eighth controllable semiconductor element T62, each having a control electrode G52, G62 and a controllable load path between two load electrodes. The seventh and the eighth controllable semiconductor element T7, T8 are connected with each other such that their respective load paths form a series connection between the first common node P and the second common node N. The seventh controllable semiconductor element T52 and the eighth controllable semiconductor element T62 are connected with each other via the third node ND3.

Each of the controllable semiconductor elements T1, T2, T3, T4, T51, T61, T52, T62 may include an intrinsic freewheeling element such as a body diode, which is electrically connected between the first load electrode and the second load electrode of the respective controllable semiconductor element T1, T2, T3, T4, T51, T61, T52, T62 (intrinsic freewheeling elements not specifically illustrated in FIG. 5). The semiconductor arrangement further includes first, second, third, fourth, fifth, sixth, seventh, and eighth freewheeling elements F1, F2, F3, F4, F51, F61, F52, F62. Each of the first, second, third, fourth, fifth, sixth, seventh, and eighth freewheeling elements F1, F2, F3, F4, F51, F61, F52, F62 includes a first electrode (e.g., anode) and a second electrode (e.g., cathode). Each of the first, second, third, fourth, fifth, sixth, seventh, and eighth freewheeling elements F1, F2, F3, F4, F51, F61, F52, F62 may be connected in parallel to one of the controllable semiconductor elements T1, T2, T3, T4, T51, T61, T52, T62.

For example, the first freewheeling element F1 may be connected to the first node ND1 with its second electrode and to the first common node P with its first electrode such that it is connected between the first node ND1 and the first common node P and in parallel to the load path of the first controllable semiconductor element T1. The second freewheeling element F2 may be connected to the first common node P with its second electrode and to the fourth node NP with its first electrode such that it is connected between the first common node P and the fourth node NP and in parallel to the load path of the second controllable semiconductor element T2. The third freewheeling element F3 may be connected to the fourth node NP with its second electrode and to the second common node N with its first electrode such that it is connected between the fourth node NP and the second common node N and in parallel to the load path of the third controllable semiconductor element T3. The fourth freewheeling element F4 may be connected to the second common node N with its second electrode and to the second node ND2 with its first electrode such that it is connected between the second common node N and the second node ND2 and in parallel to the load path of the fourth controllable semiconductor element T4. The fifth freewheeling element F51 may be connected to the first common node P with its second electrode and to the third node ND3 with its first electrode such that it is connected between the first common node P and the third node ND3 and in parallel to the fifth controllable semiconductor element T51. The sixth freewheeling element F61 may be connected to the third node ND3 with its second electrode and to the second common node N with its first electrode such that it is connected between the third node ND3 and the second common node N and in parallel to the sixth controllable semiconductor element T61. The seventh freewheeling element F52 may be connected to the first common node P with its second electrode and to the third node ND3 with its first electrode such that it is connected between the first common node P and the third node ND3 and in parallel to the seventh controllable semiconductor element T52. The eighth freewheeling element F62 may be connected to the third node ND3 with its second electrode and to the second common node N with its first electrode such that it is connected between the third node ND3 and the second common node N and in parallel to the eighth controllable semiconductor element T62.

Each of the first, second, third, fourth, fifth, sixth, seventh, and eighth controllable semiconductor element T1, T2, T3, T4, T51, T61, T52, T62 of the semiconductor arrangement of FIG. 5 may be implemented by means of one or more semiconductor bodies 20 of the semiconductor module arrangement. In particular, the first plurality of semiconductor bodies 20 may comprise at least one semiconductor body 20 forming the first controllable semiconductor element T1, at least one semiconductor body 20 forming the second controllable semiconductor element T2, at least one semiconductor body 20 forming the third controllable semiconductor element T3, and at least one semiconductor body 20 forming the fourth controllable semiconductor element T4. The first, second, third, and fourth controllable semiconductor element T1, T2, T3, T4 may form an input stage IPS of the semiconductor arrangement which is arranged on the first substrate 101, for example.

The second plurality of semiconductor bodies 20 may comprise at least one semiconductor body 20 forming the fifth controllable semiconductor element T51, and at least one semiconductor body 20 forming the sixth controllable semiconductor element T61, and the third plurality of semiconductor bodies 20 may comprise at least one semiconductor body 20 forming the seventh controllable semiconductor element T52, and at least one semiconductor body 20 forming the eighth controllable semiconductor element T62. That is, the second plurality of semiconductor bodies 20 and the third plurality of semiconductor bodies 20 may each form a half-bridge arrangement. The fifth, sixth, seventh, and eighth controllable semiconductor element T51, T61, T52, T62 may form an output stage OPS of the semiconductor arrangement, with the fifth and sixth controllable semiconductor element T51, T61 forming a first output sub-stage OPS1, and the seventh and eighth controllable semiconductor element T52, T62 forming a second output sub-stage OPS2. The first output sub-stage OPS1 and the second output sub-stage OPS2 can be operated in parallel or separately. This is, because the semiconductor bodies 20 forming the controllable semiconductor elements T51, T61 of the first output sub-stage OPS1 are arranged on the second substrate $\mathbf{10}_{21}$, and the semiconductor elements 20 forming the controllable semiconductor elements T52, T62 of the second output sub-stage OPS2 are arranged on the third substrate $\mathbf{10}_{22}$. By connecting both the second substrate $\mathbf{10}_{21}$ and the third substrate $\mathbf{10}_{22}$ to the third node ND3, the first output sub-stage OPS1 and the second output sub-stage OPS2 can be operated in parallel. If only one of the second substrate $\mathbf{10}_{21}$ and the third substrate $\mathbf{10}_{22}$ is connected to the third node ND3, the first output sub-stage OPS1 and the second output sub-stage OPS2 can be operated separately.

When the second substrate $\mathbf{10}_{21}$ and the third substrate $\mathbf{10}_{22}$ are both coupled to the third node ND3, a current will equally flow between the first node ND1 and the third node ND3 via the first substrate $\mathbf{10}_{1}$ and the second substrate $\mathbf{10}_{21}$ (first current path $\mathbf{80}_{11}$), and between the first node ND1 and the third node ND3 via the first substrate $\mathbf{10}_{1}$ and the third substrate $10_{22}$ (second current path $80_{12}$). Similarly, a current will equally flow between the second node ND2 and the third node ND3 via the first substrate $10_1$ and the second substrate $10_{21}$ (third current path $80_{13}$), and between the second node ND2 and the third node ND3 via the first substrate $10_1$ and the third substrate $10_{22}$ (fourth current path $80_{14}$). If, for example, the third substrate $10_{22}$ is not coupled to the third node ND3, the second current path $80_{12}$ and the fourth current path $80_{14}$ are inactive (no current will flow through the respective current paths). The same applies for the first current path $80_{11}$ and the third current path $80_{13}$, if the second substrate $10_{21}$ is not connected to the third node ND3.

Figure 3:
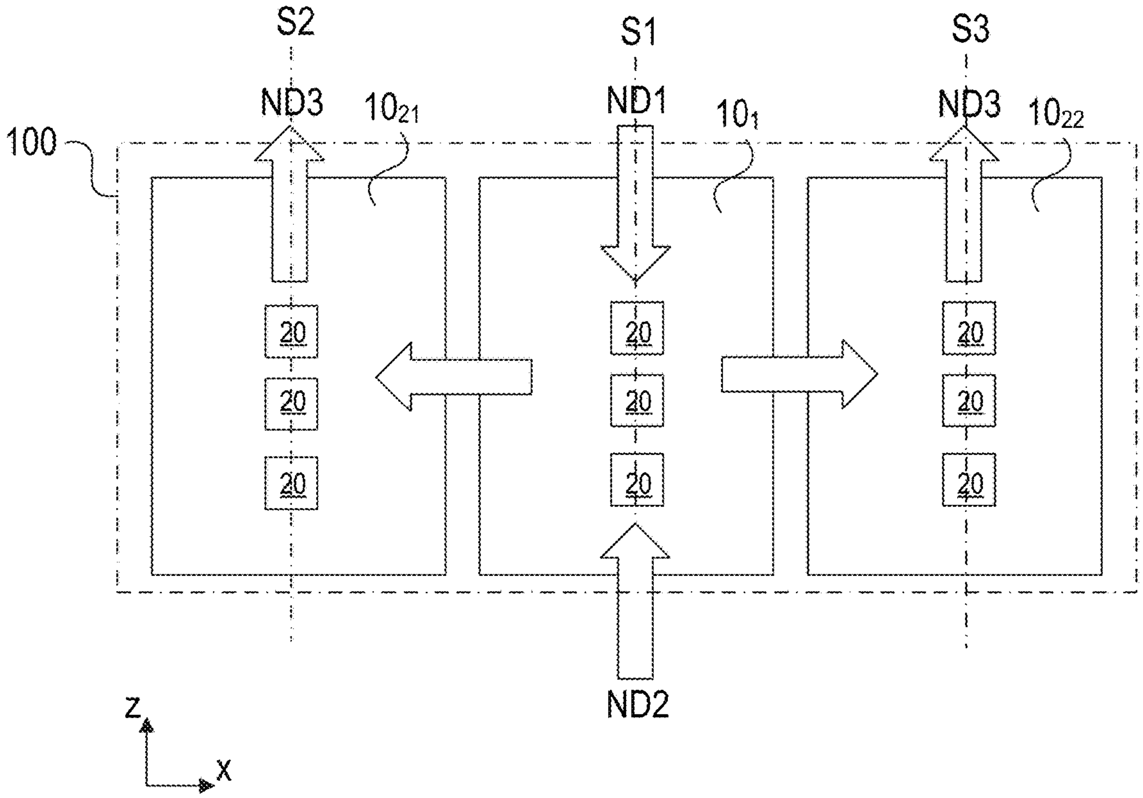
FIG. 3 is a schematic top view of a semiconductor module arrangement according to further embodiments of the disclosure.

As has been described above, a layout of the third substrate $10_{22}$ with the third plurality of semiconductor bodies 20 arranged thereon equals a layout of the second substrate $10_{21}$ with the second plurality of semiconductor bodies 20 arranged thereon. Now referring to FIG. 3, according to one embodiment of the disclosure, at least the second plurality of semiconductor bodies 20 may be arranged on the second substrate $10_{21}$ symmetrically about a second axis of symmetry S2, and the third plurality of semiconductor bodies 20 may be arranged on the third substrate $10_{22}$ symmetrically about a third axis of symmetry S3. It is, however, also possible that the entire layout of the second and third substrate $10_{21}$, $10_{22}$ is symmetric about the second axis of symmetry S2 and the third axis of symmetry S3, respectively. That is, any other elements of the substrates $10_{21}$, $10_{22}$, such as, for example, different sections of the first metallization layer 111, electrical connections 3, terminal elements 40, etc., may also be arranged symmetrically about the second axis of symmetry S2 and the third axis of symmetry S3, respectively. Additionally or alternatively, at least the first plurality of semiconductor bodies 20 may be arranged on the first substrate $10_1$ symmetrically about a first axis of symmetry S1. It is, however, also possible that the entire layout of the first substrate $10_1$ is symmetric about the first axis of symmetry S1. That is, any other elements of the first substrate 101, such as, for example, different sections of the first metallization layer 111, electrical connections 3, terminal elements 40, etc., may also be arranged symmetrically about the first axis of symmetry S1. For example, the relevant stray inductances in a semiconductor arrangement (e.g., stray inductances between first node ND1 and fourth node NP, and between second node ND2 and fourth node NP) can be very low when implementing a layout of the first substrate $10_1$ accordingly.

Figure 4:
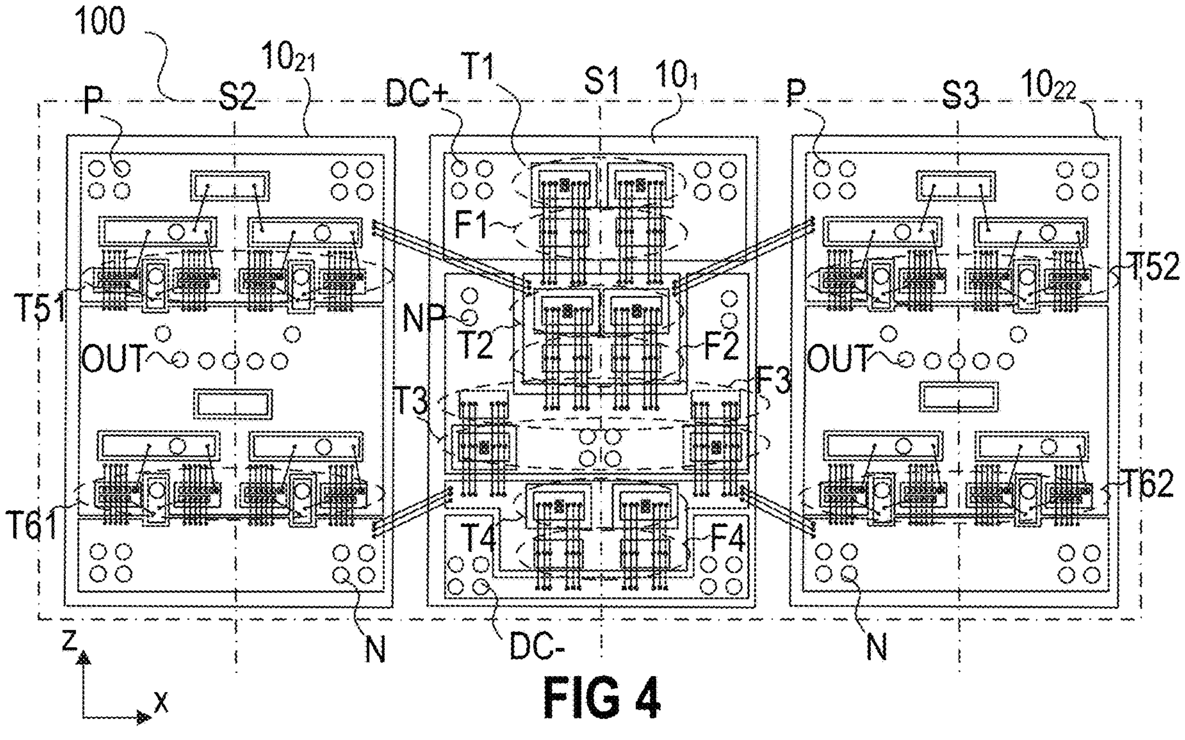
FIG. 4 is a top view of a semiconductor module arrangement according to further embodiments of the disclosure.

Now referring to FIG. 4, a top view of a semiconductor module arrangement 100 according to embodiments of the disclosure is schematically illustrated. The first metallization layer 111 of the first substrate $10_1$ may comprise at least five different sections, for example. The one or more semiconductor bodies forming the first controllable semiconductor element T1 may be arranged on and electrically coupled to a first section of the first metallization layer 111 of the first substrate $10_1$. Similarly, one or more semiconductor elements forming the first freewheeling element F1 may be arranged on and electrically coupled to the first section. The first section may form or may be connected to the first node ND1. The one or more semiconductor bodies forming the first controllable semiconductor element T1 and the one or more semiconductor elements forming the first freewheeling element F1 may further be electrically coupled to a second section of the first metallization layer 111 of the first substrate $10_1$ by means of one or more electrically conducting connection elements (e.g., bonding wires).

One or more semiconductor bodies 20 forming the second controllable semiconductor element T2 and one or more semiconductor elements forming the second freewheeling element F2 are arranged on and electrically coupled to the second section. The second section may form or may be connected to the first common node P. The one or more semiconductor bodies 20 forming the second controllable semiconductor element T2 and the one or more semiconductor elements forming the second freewheeling element F2 may further be electrically coupled to a third section of the first metallization layer 111 of the first substrate 101 by means of one or more electrically conducting connection elements (e.g., bonding wires).

One or more semiconductor bodies 20 forming the third controllable semiconductor element T3 and one or more semiconductor elements forming the third freewheeling element F3 are arranged on and electrically coupled to the third section. The third section may form or may be connected to the fourth node NP. The one or more semiconductor bodies 20 forming the third controllable semiconductor element T3 and the one or more semiconductor elements forming the third freewheeling element F3 may further be electrically coupled to a fourth section of the first metallization layer 111 of the first substrate 101 by means of one or more electrically conducting connection elements (e.g., bonding wires).

One or more semiconductor bodies 20 forming the fourth controllable semiconductor element T4 and one or more semiconductor elements forming the fourth freewheeling element F4 are arranged on and electrically coupled to the fourth section. The fourth section may form or may be connected to the second common node N. The one or more semiconductor bodies 20 forming the fourth controllable semiconductor element T4 and the one or more semiconductor elements forming the fourth freewheeling element F4 may further be electrically coupled to a fifth section of the first metallization layer 111 of the first substrate $10_1$ by means of one or more electrically conducting connection elements (e.g., bonding wires). The fifth section may form or may be connected to the second node ND2. The first metallization layer 111 of the first substrate 101 may comprise further sections, such as, for example, for providing control signals to the control electrodes of the controllable semiconductor elements. Such additional sections, however, are not relevant for the general concept and understanding of the underlying principle and are therefore omitted for improved clearness.

The second section of the first metallization layer 111 of the first substrate $10_1$ may be electrically coupled to the second substrate $10_{21}$ by means of one or more electrical connection elements (e.g., bonding wires, bonding ribbons, or connection rails), and to the third substrate $10_{22}$ by means of one or more electrical connection elements (e.g., bonding wires, bonding ribbons, or connection rails). For example, the second section of the first metallization layer 111 of the first substrate $10_1$ which may form or may be connected to the first common node P, may be electrically coupled to the respective sections of the first metallization layers 111 of the second substrate $10_{21}$ and the third substrate $10_{22}$ (as will be described in the following with respect to FIG. 7). The fourth section of the first metallization layer 111 of the first substrate 101 may be electrically coupled to the second substrate $10_{21}$ by means of one or more electrical connection elements (e.g., bonding wires, bonding ribbons, or connection rails), and to the third substrate $10_{22}$ by means of one or more electrical connection elements (e.g., bonding wires, bonding ribbons, or connection rails). For example, the fourth section of the first metallization layer 111 of the first substrate $10_1$ which may form or may be connected to the second common node N, may be electrically coupled to the respective sections of the first metallization layers 111 of the second substrate $10_{21}$ and the third substrate $10_{22}$ (as will be described in the following with respect to FIG. 7).

The first node ND1 may be a first supply node DC+, the second node ND2 may be a second supply node DC−, and the third node ND3 may be an output node OUT, as has been described above and as schematically illustrated in FIGS. 4, 5 and 6. This, however, is only an example. Generally, the ANPC topology as described above is only an example. The general principles similarly apply to different (three-level converter) topologies as, for example, neutral point clamped NPC (e.g., NPC1 or NPC2) topologies. The first, second and third nodes ND1, ND2, ND3 described with respect to FIGS. 2 and 3 above may be any nodes of a topology implemented according to the principles described herein.

Figure 7:
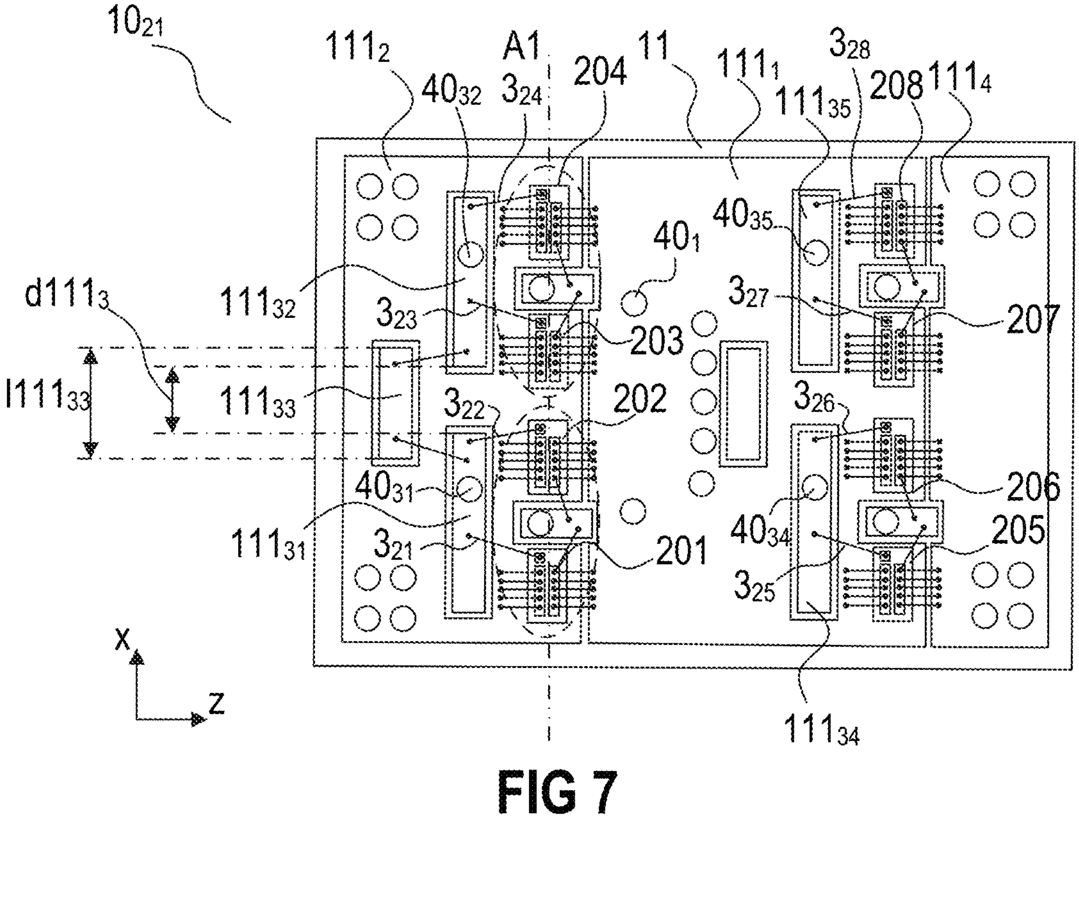
FIG. 7 is a top view of a second substrate of a semiconductor module arrangement according to embodiments of the disclosure.

Now referring to FIG. 7, a second substrate $10_{21}$ of a semiconductor module arrangement 100 according to embodiments of the disclosure is schematically illustrated. The second substrate $10_{21}$ as illustrated in FIG. 7 generally corresponds to the second substrate $10_{21}$ (and the third substrate $10_{22}$) as illustrated in FIG. 4, but is illustrated in more detail in FIG. 7. The second substrate $10_{21}$ in this example comprises a dielectric insulation layer 11 and a first metallization layer 111 arranged on a surface of the dielectric insulation layer 11. The first metallization layer 111 comprises a first section $111_1$, a second section $111_2$, a third section $111_{31}$, and a fourth section $111_{32}$, wherein the second section $111_2$ horizontally surrounds each of the third section $111_{31}$, and the fourth section $111_{32}$. The second substrate $10_{21}$ further comprises first, second, third, and fourth semiconductor bodies 201, 202, 203, 204 arranged on the first metallization layer 111, wherein each of the first semiconductor body 201, the second semiconductor body 202, the third semiconductor body 203, and the fourth semiconductor body 204 has a first contact pad, a second contact pad, and a third contact pad. The third contact pads may form or may be coupled to a control electrode (e.g., gate electrode) of the respective semiconductor body 201, 202, 203, 204, respectively. In particular, each of the first, second, third, and fourth semiconductor body 201, 202, 203, 204 may comprise a control electrode and a controllable load path between a first load electrode and a second load electrode. The first contact pads may form or may be coupled to the respective first load electrode (e.g., drain electrode), and the second contact pads may form or may be coupled to the respective second load electrode (e.g., source electrode) of the respective semiconductor body 201, 202, 203, 204, for example.

The third contact pad of the first semiconductor body 201 is electrically coupled to the third section $111_{31}$ of the first metallization layer 111 by means of a first electrical connection element $3_{21}$, the third contact pad of the second semiconductor body 202 is electrically coupled to the third section $111_{31}$ of the first metallization layer 111 by means of a second electrical connection element $3_{22}$, the third contact pad of the third semiconductor body 203 is electrically coupled to the fourth section $111_{32}$ of the first metallization layer 111 by means of a third electrical connection element $3_{23}$, and the third contact pad of the fourth semiconductor body 204 is electrically coupled to the fourth section $111_{32}$ of the first metallization layer 111 by means of a fourth electrical connection element $3_{24}$. Each of the first, second, third, and fourth electrical connection elements $3_{21}$, $3_{22}$, $3_{23}$, $3_{24}$ comprises one or more bonding wires, one or more bonding ribbons, or a connection rail.

According to one example, the first, second, third, and fourth semiconductor bodies 201, 202, 203, 204 are identical to each other. That is the semiconductor bodies may all be implemented as GaN (gallium nitride) semiconductor devices, or may all be implemented as Si (silicon) semiconductor devices, for example, wherein each semiconductor body may be readily replaced by any of the other semiconductor bodies without affecting the electrical properties and the function of the semiconductor module arrangement. Any other kind of semiconductor device could be used instead. According to another example, the first and second semiconductor bodies 201, 202 are identical to each other, the third and fourth semiconductor bodies 203, 204 are identical to each other, and the first and second semiconductor bodies 201, 202 differ from the third and fourth semiconductor bodies 203, 204. For example, the first and second semiconductor bodies 201, 202 may be implemented as a first kind of semiconductor device (e.g., GaN semiconductor device), while the third and fourth semiconductor bodies 203, 204 are implemented as a second kind of semiconductor device that differs from the first kind of semiconductor device (e.g., Si semiconductor device), or vice versa. In the latter case, the first semiconductor body 201 could be readily replaced by the second semiconductor body 202, or vice versa, without affecting the electrical properties and the function of the semiconductor module arrangement. Similarly, the third semiconductor body 203 could be readily replaced by the fourth semiconductor body 204, or vice versa, without affecting the electrical properties and the function of the semiconductor module arrangement.

Still referring to FIG. 7, the second substrate $10_{21}$ further comprises at least one third terminal element $40_{31}$ arranged on the third section $111_{31}$, and at least one fourth terminal element $40_{32}$ arranged on the fourth section $111_{32}$. A fifth current path between the third contact pad of the first semiconductor body 201 and the at least one third terminal element $40_{31}$ provides identical voltage and current transfer characteristics as a sixth current path between the third contact pad of the second semiconductor body 202 and the at least one third terminal element $40_{31}$, and a seventh current path between the third contact pad of the third semiconductor body 203 and the at least one fourth terminal element $40_{32}$ provides identical voltage and current transfer characteristics as an eighth current path between the third contact pad of the fourth semiconductor body 204 and the at least one fourth terminal element $40_{32}$.

The second substrate $10_{21}$ may further comprise a fifth section $111_{33}$ of the first metallization layer 11, wherein the second section $111_2$ horizontally surrounds the fifth section $111_{33}$. The fifth section $111_{33}$ may be electrically coupled to the third section $111_{31}$ by means of an electrical connection element 3, and may be electrically coupled to the fourth section $111_{32}$ by means of an electrical connection element 3. Generally, the fifth section $111_{33}$ may also be omitted. According to other embodiments, the at least one third terminal element $40_{31}$, and the at least one fourth terminal element $40_{32}$ arranged on the third section $111_{31}$ and the fourth section $111_{32}$, respectively, may be omitted. In the latter case, at least one fifth terminal element may be arranged on the fifth section $111_{33}$. That is, a control signal may be provided to the first semiconductor body 201 via the one or more terminal elements arranged on the fifth section $111_{33}$, the electrical connection element 3 electrically coupling the fifth section $111_{33}$ and the third section $111_{31}$, the third section $111_{31}$, and the first electrical connection element $3_{21}$. This applies similarly for the second semiconductor body 202, the third semiconductor body 203, and the fourth semiconductor body 204.

If the second substrate $\mathbf{10}_{21}$ further comprises at least one fifth terminal element arranged on the fifth section $\mathbf{111}_{33}$ of the first metallization layer 111, a current path between the at least one fifth terminal element and the third contact pad of the first semiconductor body 201 may provide identical voltage and current transfer characteristics as each of a current path between the at least one fifth terminal element and the third contact pad of the second semiconductor body 202, a current path between the at least one fifth terminal element and the third contact pad of the third semiconductor body 203, and a current path between the at least one fifth terminal element and the third contact pad of the fourth semiconductor body 204.

The first contact pads of the first, second, third, and fourth semiconductor body 201, 202, 203, 204 may be electrically coupled to the first section $\mathbf{111}_1$ of the first metallization layer 111, and the second contact pads of the first, second, third, and fourth semiconductor body 201, 202, 203, 204 may be electrically coupled to the second section $\mathbf{111}_2$ of the first metallization layer 111. According to one example, the second contact pads of the semiconductor bodies 201, 202, 203, 204 may be source pads, and the first contact pads of the semiconductor bodies 201, 202, 203, 204 may be drain pads. Each of the first contact pads of the first, second, third, and fourth semiconductor body 201, 202, 203, 204 may be electrically coupled to the first section $\mathbf{111}_1$ of the first metallization layer 111 by means of an electrical connection element 3, and each of the second contact pads of the first, second, third, and fourth semiconductor body 201, 202, 203, 204 may be electrically coupled to the second section $\mathbf{111}_2$ of the first metallization layer 111 by means of an electrical connection element 3. Each of the electrical connection elements 3 may comprise one or more bonding wires, one or more bonding ribbons, a connection rail, or a section of an additional metallization layer of the substrate 10 that is contacted by corresponding vias, for example. The first, second, third, and fourth semiconductor body 201, 202, 203, 204 may be arranged on the second section $\mathbf{111}_2$ of the first metallization layer 111. That is, the semiconductor bodies 201, 202, 203, 204 may be arranged on that section of the first metallization layer to which their respective second contact pads are electrically coupled (e.g., semiconductor bodies arranged on source potential).

FIG. 7 schematically illustrates an exemplary second substrate $\mathbf{10}_{21}$. As has been mentioned above, the same may apply for the identical third substrate $\mathbf{10}_{22}$. The first, second, third, and fourth semiconductor bodies 201, 202, 203, 204 arranged on the first metallization layer 111 of the second substrate $\mathbf{10}_{21}$ may form the fifth controllable semiconductor element T51, and the first, second, third, and fourth semiconductor bodies 201, 202, 203, 204 arranged on the first metallization layer 111 of the third substrate $\mathbf{10}_{22}$ may form the seventh controllable semiconductor element T52.

Still referring to FIG. 7, the second substrate $\mathbf{10}_{21}$, and similarly the third substrate $\mathbf{10}_{22}$ may further comprise a sixth section $\mathbf{111}_4$, a seventh section $\mathbf{111}_{34}$, and an eighth section $\mathbf{111}_{35}$ of the first metallization layer 11, wherein the first section $\mathbf{111}_1$ horizontally surrounds each of the seventh section $\mathbf{111}_{34}$, and the eighth section $\mathbf{111}_{35}$. The second substrate $\mathbf{10}_{21}$ may further comprise fifth, sixth, seventh, and eighth semiconductor bodies 205, 206, 207, 208 arranged on the first metallization layer 111, wherein each of the fifth semiconductor body 205, the sixth semiconductor body 206, the seventh semiconductor body 207, and the eighth semiconductor body 208 has a first contact pad, a second contact pad, and a third contact pad. The third contact pad of the fifth semiconductor body 205 may be electrically coupled to the seventh section $\mathbf{111}_{34}$ of the first metallization layer 111 by means of a fifth electrical connection element $\mathbf{3}_{25}$, the third contact pad of the sixth semiconductor body 206 may be electrically coupled to the seventh section $\mathbf{111}_{34}$ of the first metallization layer 111 by means of a sixth electrical connection element $\mathbf{3}_{26}$, the third contact pad of the seventh semiconductor body 207 may be electrically coupled to the eighth section $\mathbf{111}_{35}$ of the first metallization layer 111 by means of a seventh electrical connection element $\mathbf{3}_{27}$, and the third contact pad of the eighth semiconductor body 208 may be electrically coupled to the eighth section $\mathbf{111}_{35}$ of the first metallization layer 111 by means of an eighth electrical connection element $\mathbf{3}_{28}$. Each of the fifth, sixth, seventh, and eighth electrical connection elements $\mathbf{3}_{25}$, $\mathbf{3}_{26}$, $\mathbf{3}_{27}$, $\mathbf{3}_{28}$ may comprise one or more bonding wires, one or more bonding ribbons, or a connection rail, for example.

Similar to what has been described with respect to the first, second, third, and fourth semiconductor bodies 201, 202, 203, 204 above, according to one example, the fifth, sixth, seventh, and eighth semiconductor bodies 205, 206, 207, 208 are identical to each other. According to another example, the fifth and sixth semiconductor bodies 205, 206 are identical to each other, the seventh and eighth semiconductor bodies 207, 208 are identical to each other, and the fifth and sixth semiconductor bodies 205, 206 differ from the seventh and eighth semiconductor bodies 207, 208.

The second substrate $\mathbf{10}_{21}$ may further comprise at least one sixth terminal element $\mathbf{40}_{34}$ arranged on the seventh section $\mathbf{111}_{34}$, and at least one seventh terminal element $\mathbf{40}_{35}$ arranged on the eighth section $\mathbf{111}_{35}$. A ninth current path between the third contact pad of the fifth semiconductor body 205 and the at least one sixth terminal element $\mathbf{40}_{34}$ may provide identical voltage and current transfer characteristics as a tenth current path between the third contact pad of the sixth semiconductor body 206 and the at least one sixth terminal element $\mathbf{40}_{34}$. Similarly, an eleventh current path between the third contact pad of the seventh semiconductor body 207 and the at least one seventh terminal element $\mathbf{40}_{35}$ may provide identical voltage and current transfer characteristics as a twelfth current path between the third contact pad of the eighth semiconductor body 208 and the at least one seventh terminal element $\mathbf{40}_{35}$.

The first contact pads of the fifth, sixth, seventh, and eighth semiconductor body 205, 206, 207, 208 may be electrically coupled to the sixth section $\mathbf{111}_4$ of the first metallization layer 111, and the second contact pads of the fifth, sixth, seventh, and eighth semiconductor body 205, 206, 207, 208 may be electrically coupled to the first section $\mathbf{111}_1$ of the first metallization layer 111. According to one example, the second contact pads of the semiconductor bodies 205, 206, 207, 208 may be source pads, and the first contact pads of the semiconductor bodies 205, 206, 207, 208 may be drain pads. Each of the first contact pads of the fifth, sixth, seventh, and eighth semiconductor body 205, 206, 207, 208 may be electrically coupled to the sixth section $\mathbf{111}_4$ of the first metallization layer 111 by means of an electrical connection element 3, and each of the second contact pads of the fifth, sixth, seventh, and eighth semiconductor body 205, 206, 207, 208 may be electrically coupled to the first section $\mathbf{111}_1$ of the first metallization layer 111 by means of an electrical connection element 3. Each of the electrical connection elements 3 may comprise one or more bonding wires, one or more bonding ribbons, a connection rail, or a section of an additional metallization layer of the substrate 10 that is contacted by corresponding vias, for example. The fifth, sixth, seventh, and eighth semiconductor body 205, 206, 207, 208 may be arranged on the first section $\mathbf{111}_1$ of the first metallization layer 111. That is, the semiconductor bodies 205, 206, 207, 208 may be arranged on that section of the first metallization layer 111 to which their respective second contact pads are electrically coupled (e.g., semiconductor bodies arranged on source potential).

The first section $\mathbf{111}_1$ of the first metallization layer 111 may form or may be connected to the third node ND3, the second section $\mathbf{111}_2$ of the first metallization layer 111 may form or may be connected to the first common node P, and the sixth section $\mathbf{111}_4$ of the first metallization layer 111 may form or may be connected to the second common node N. That is, the second sections $\mathbf{111}_2$ of the first metallization layers 111 of the second substrate $\mathbf{10}_{21}$ and the third substrate $\mathbf{10}_{22}$ may be electrically coupled to the second section of the first metallization layer 111 of the first substrate $\mathbf{10}_1$. Further, the sixths sections $\mathbf{111}_4$ of the first metallization layers 111 of the second substrate $\mathbf{10}_{21}$ and the third substrate $\mathbf{10}_{22}$ may be electrically coupled to the fourth section of the first metallization layer 111 of the first substrate $\mathbf{10}_1$.

In the embodiments exemplarily illustrated in the Figures, the semiconductor bodies 201, 202, . . . , 208 are illustrated as lateral semiconductor devices such as, for example, GaN HEMTs, which have all contact pads (e.g., gate, source and drain contact pads) arranged on their top side and no contact pads on their bottom side. This, however, is only an example. It is also possible to implement the semiconductor bodies 201, 202, . . . , 208 as vertical semiconductor devices instead. Further, in the examples described above, the controllable semiconductor devices T1, T2, T3, T4, T51, T61, T52, T62 of the arrangement of FIG. 5 are each implemented by means of two semiconductor bodies electrically coupled in parallel. It is generally also possible, that the controllable semiconductor devices T1, T2, T3, T4, T51, T61, T52, T62 are implemented by only one or even more than two semiconductor bodies. Even further, the ANPC topology as described above is only an example. The general principles similarly apply to different (three-level converter) topologies as, for example, neutral point clamped NPC (e.g., NPC1 or NPC2) topologies.

By implementing the second substrate $\mathbf{10}_{21}$ and the third substrate $\mathbf{10}_{22}$ identically (layout of second substrate $\mathbf{10}_{21}$ equals the layout of third substrate $\mathbf{10}_{22}$), the two substrates may be operated in parallel (parallel operation) as well as independent from each other (interleaved operation). The resulting switching performance and power dissipation of the second substrate $\mathbf{10}_{21}$ and the third substrate $\mathbf{10}_{22}$ are identical. Therefore, for parallel operation, no derating due to asymmetrically distributed parasitics will have to be considered. Cooling efficiency of the semiconductor module arrangement may be improved, such as, for example, by using different materials for the different substrates. For example, the first substrate $\mathbf{10}_1$ (e.g., dielectric insulation layer 11 of first substrate $\mathbf{10}_1$) may consist of a different (ceramic) material as the second and third substrate $\mathbf{10}_{21}$, $\mathbf{10}_{22}$ (e.g., dielectric insulation layers 11 of second and third substrate $\mathbf{10}_{21}$, $\mathbf{10}_{22}$). For example, the second and third substrate $\mathbf{10}_{21}$, $\mathbf{10}_{22}$ may each comprise a dielectric insulation layer 11 having a better thermal performance, for example, a higher thermal conductivity, as compared to the dielectric insulation layer 11 of the first substrate $\mathbf{10}_1$. In this way, the cooling efficiency of the second and third substrate $\mathbf{10}_{21}$, $\mathbf{10}_{22}$ may be maximized, while using a less expensive first substrate $\mathbf{10}_1$ which does not necessarily require a very high cooling efficiency. The cooling efficiency of the second and third substrate $\mathbf{10}_{21}$, $\mathbf{10}_{22}$, however, may be the same in order to achieve a higher symmetry of the arrangement.

Figure 6:
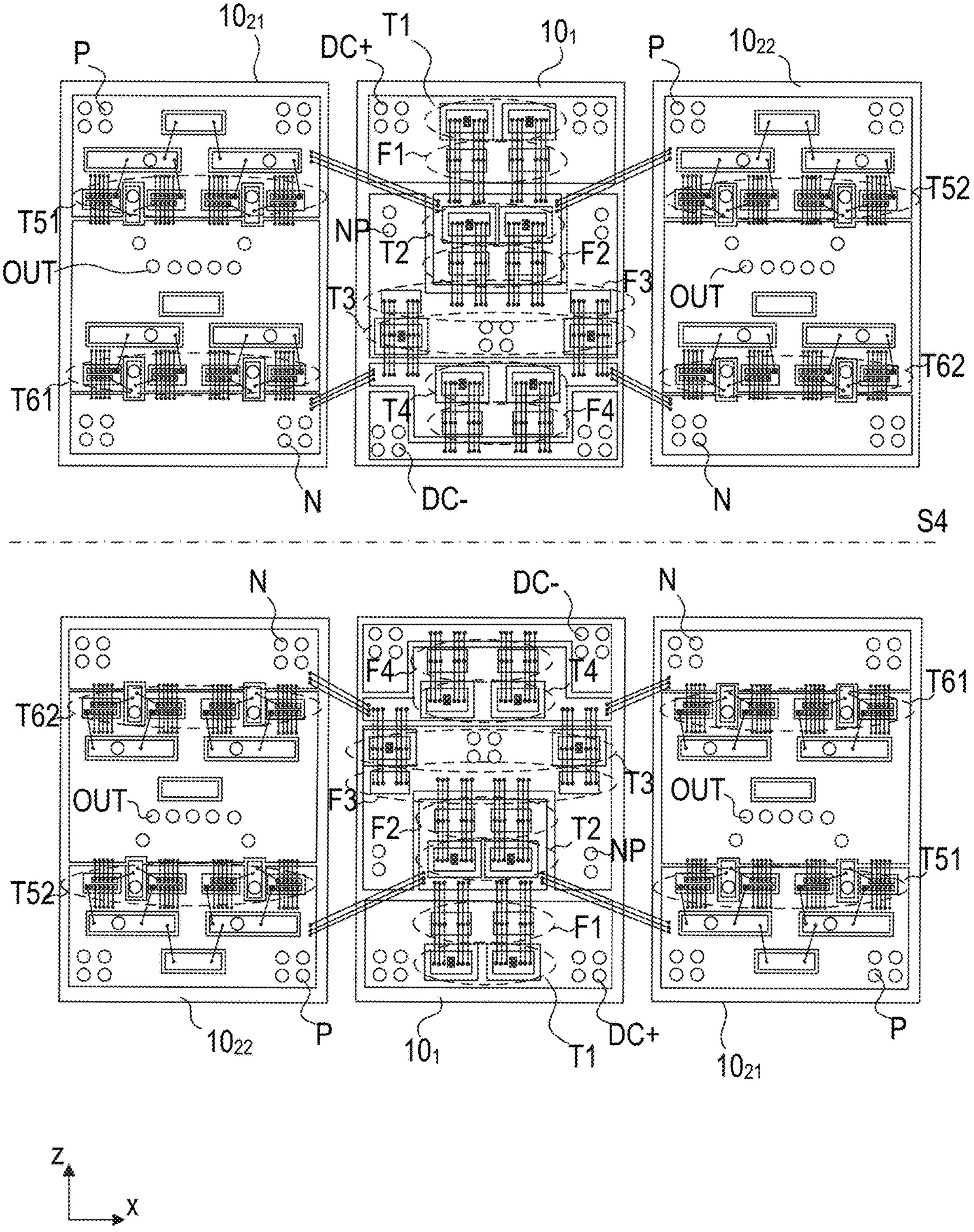
FIG. 6 is a top view of a symmetric arrangement of semiconductor module arrangements according to even further embodiments of the disclosure.

Now referring to FIG. 6, it is further possible to operate two (or more) semiconductor module arrangements 100 as have been described above in parallel. That is, a semiconductor module arrangement according to further embodiments of the disclosure may comprise a first semiconductor module arrangement (e.g., as has been described with respect to FIGS. 2, 3 and 4 above) and an identical second semiconductor module arrangement (e.g., as has been described with respect to FIGS. 2, 3 and 4 above). The first semiconductor module arrangement and the second semiconductor module arrangement may be arranged next to each other in one plane and symmetrical about a fourth axis of symmetry S4. In this way, electrical contacts of the first semiconductor module arrangement that are connected to a certain electric potential face towards the electrical contacts of the second semiconductor module arrangement that are connected to the same electric potential. In this way, maximum power density and high symmetry may be achieved in particular when the semiconductor module arrangements are electrically coupled in parallel to each other. For example, bus bars or connection rails (not specifically illustrated in FIG. 6) may be arranged between the first semiconductor module arrangement and the second semiconductor module arrangement which electrically contact both semiconductor module arrangements equally.

Figure 8:
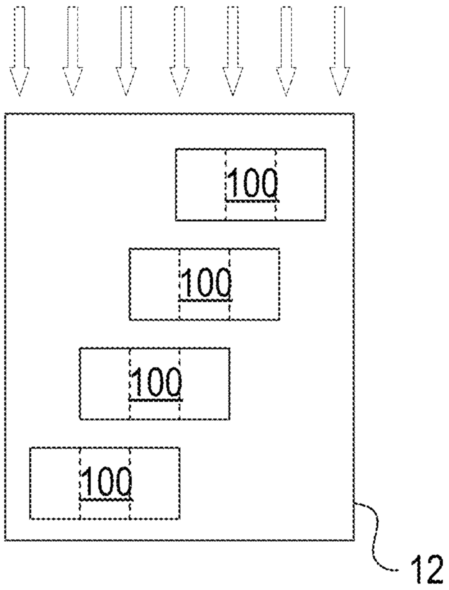
FIG. 8 is a top view of a heat sink with a plurality of semiconductor module arrangements arranged thereon according to embodiments of the disclosure.

Now, referring to FIG. 8, a heat sink 12 with a plurality of semiconductor module arrangements 100 arranged thereon is schematically illustrated. Each of the plurality of semiconductor module arrangements 100 may act as an independent output stage or leg of an inverter topology, for example. The plurality of semiconductor module arrangements 100 may be operated in parallel, similar to what has been described above. In this case, contacting of the different semiconductor module arrangements of the plurality of semiconductor module arrangements may be essentially equal/identical (e.g., identical stray inductances).

When arranging a plurality of semiconductor module arrangements on one and the same heat sink, the semiconductor module arrangements are often arranged in a single row on the heat sink in order to reduce the overall size of the heat sink (minimum heat sink area). In such an arrangement, however, substrates with maximum dissipated power (e.g., second substrate $\mathbf{10}_{21}$ and third substrate $\mathbf{10}_{22}$ as described above) are all positioned in one row and, therefore, in the same airflow path. That is, an air flow reaching the first semiconductor module arrangement will get heated and the heated air flow will then reach the second semiconductor module arrangement, get heated even further, and so on. This can be avoided by means of the arrangement illustrated in FIG. 8. The semiconductor module arrangements 100 in this example are all arranged offset with respect to each other. Two directly successive semiconductor module arrangements in this example overlap by two thirds or their respective sizes. The first, second and third substrates of the semiconductor module arrangements 100 are only schematically indicated by means of dashed lines. As can be seen, an air flow in this example reaches the second substrate (left substrate) of a first one of the semiconductor module arrangements first and will subsequently pass the first substrate (middle substrate) of a subsequent semiconductor module arrangement which is generally not as hot as the second substrate (main heat will be generated on second and third substrate). The air flow subsequently only passes the third substrate (right substrate) of one further semiconductor module arrangement. This similarly applies for each of the semiconductor module arrangements 100. That is, an air flow will never pass more than two second/third substrates and will not get heated as much as in conventional arrangements. The offset arrangement of FIG. 8, however, requires at least double the size of the heat sink 12 as compared to conventional arrangements.

Figure 9:
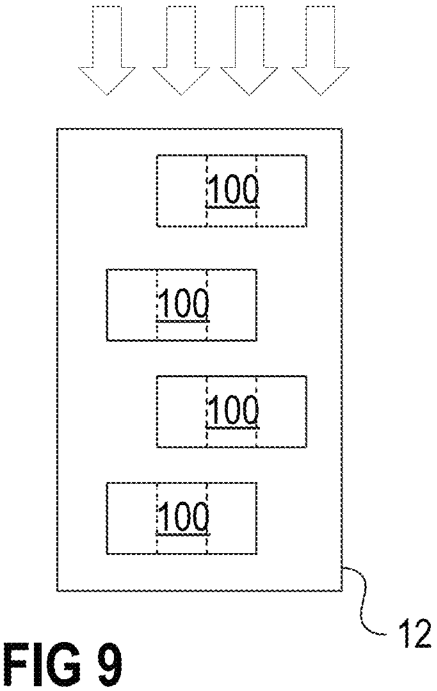
FIG. 9 is a top view of a heat sink with a plurality of semiconductor module arrangements arranged thereon according to further embodiments of the disclosure.

The arrangement as illustrated in FIG. 9 is a compromise between the arrangement of FIG. 8 and the conventional arrangement as described above. In this example, the different semiconductor module arrangements are arranged in an alternated shifted way. That is, one semiconductor module arrangement 100 and each directly preceding or successive semiconductor module arrangement 100 are shifted with respect to each other (overlap of, for example, two thirds). Each semiconductor module arrangement 100, however, fully overlaps with every second preceding or successive semiconductor module arrangement 100. That is, two (if four semiconductor module arrangements 100 are arranged on the same heat sink 12) or more (if more than two semiconductor module arrangements are arranged on the same heat sink 12) semiconductor module arrangements are arranged in the same row.

The air flow in the example illustrated in FIG. 9, for example, reaches the second substrate (left substrate) of a first one of the plurality of semiconductor module arrangements 100, the first substrate (middle substrate) of a second one of the semiconductor module arrangements, the second substrate (left substrate) of a third one of the semiconductor module arrangements, and the first substrate (middle substrate) of a fourth one of the semiconductor module arrangements. That is, the air flow reaches the hot part of a semiconductor module arrangement 100 and the cooler part of a semiconductor module arrangement by turns. In this way the size of the heat sink 12 may be decreased as compared to the arrangement of FIG. 8. The required air flow, is increased as compared to the arrangement of FIG. 8, as is schematically illustrated by means of the thicker arrows in FIG. 9, but is still decreased as compared to conventional arrangements.

The invention claimed is:

1. A semiconductor module arrangement comprising:

a first substrate with a first plurality of semiconductor bodies arranged thereon;

a second substrate with a second plurality of semiconductor bodies arranged thereon; and a third substrate with a third plurality of semiconductor bodies arranged thereon, wherein:

the first plurality of semiconductor bodies, the second plurality of semiconductor bodies and the third plurality of semiconductor bodies together form a semiconductor arrangement, the semiconductor arrangement comprising a first node configured to be operatively coupled to a first electrical potential, and a second node configured to be operatively coupled to a second electrical potential that is different from the first electrical potential, a layout of the third substrate with the third plurality of semiconductor bodies arranged thereon equals a layout of the second substrate with the second plurality of semiconductor bodies arranged thereon, the first substrate is configured to be connected to the first node and the second node, the second substrate is configured to be connected to a third node, the third substrate is configured to be connected to the third node, a first current path extending between the first node and the third node via the first substrate and the second substrate provides one or more identical voltage and current transfer characteristics as a second current path extending between the first node and the third node via the first substrate and the third substrate, and a third current path extending between the second node and the third node via the first substrate and the second substrate provides one or more identical voltage and current transfer characteristics as a fourth current path extending between the second node and the third node via the first substrate and the third substrate.

2. The semiconductor module arrangement of claim 1, wherein:

the semiconductor bodies of the first plurality of semiconductor bodies are slow switching semiconductor bodies, and the semiconductor bodies of the second plurality of semiconductor bodies and the semiconductor bodies of the third plurality of semiconductor bodies are fast switching semiconductor bodies, and a fast switching semiconductor body is a semiconductor body that switches between different switching states faster than a defined threshold speed, and a slow switching semiconductor body is a semiconductor body that switches between different switching states slower than the defined threshold speed.

3. The semiconductor module arrangement of claim 1, wherein:

the semiconductor arrangement formed by the first plurality of semiconductor bodies, the second plurality of semiconductor bodies, and the third plurality of semiconductor bodies comprises an input stage and an output stage, the input stage is formed by the first plurality of semiconductor bodies, and the second plurality of semiconductor bodies forms a first output sub-stage, and the third plurality of semiconductor bodies forms an identical second output sub-stage.

4. The semiconductor module arrangement of claim 1, wherein the second plurality of semiconductor bodies and the third plurality of semiconductor bodies each form a half-bridge arrangement.

5. The semiconductor module arrangement of claim 1, wherein the semiconductor arrangement formed by the first plurality of semiconductor bodies, the second plurality of semiconductor bodies, and the third plurality of semiconductor bodies further comprises:

a fourth node configured to be operatively connected to a third electrical potential that is different from the first electrical potential and the second electrical potential, a first controllable semiconductor element and a second controllable semiconductor element, each having a control electrode and a controllable load path between two load electrodes, the first and the second controllable semiconductor element being connected with each other such that their respective load paths form a series connection between the first node and the fourth node, the first controllable semiconductor element and the second semiconductor element being connected with each other via a first common node, a third controllable semiconductor element and a fourth controllable semiconductor element, each having a control electrode and a controllable load path between two load electrodes, the third and the fourth controllable semiconductor element being connected with each other such that their respective load paths form a series connection between the fourth node and the second node, the third controllable semiconductor element and the fourth controllable semiconductor element being connected with each other via a second common node, a fifth controllable semiconductor element and a sixth controllable semiconductor element, each having a control electrode and a controllable load path between two load electrodes, the fifth and the sixth controllable semiconductor element being connected with each other such that their respective load paths form a series connection between the first common node and the second common node, the fifth controllable semiconductor element and the sixth controllable semiconductor element being connected with each other via the third node, a seventh controllable semiconductor element and an eighth controllable semiconductor element, each having a control electrode and a controllable load path between two load electrodes, the seventh and the eighth controllable semiconductor element being connected with each other such that their respective load paths form a series connection between the first common node and the second common node, the seventh controllable semiconductor element and the eighth controllable semiconductor element being connected with each other via the third node.

6. The semiconductor module arrangement of claim 5, wherein:

the first plurality of semiconductor bodies comprises at least one semiconductor body forming the first controllable semiconductor element, at least one semiconductor body forming the second controllable semiconductor element, at least one semiconductor body forming the third controllable semiconductor element, and at least one semiconductor body forming the fourth controllable semiconductor element, the second plurality of semiconductor bodies comprises at least one semiconductor body forming the fifth controllable semiconductor element, and at least one semiconductor body forming the sixth controllable semiconductor element, and the third plurality of semiconductor bodies comprises at least one semiconductor body forming the seventh controllable semiconductor element, and at least one semiconductor body forming the eighth controllable semiconductor element.

7. The semiconductor module arrangement of claim 5, wherein at least one of the second substrate or the third substrate comprises:

a dielectric insulation layer and a first metallization layer arranged on a surface of the dielectric insulation layer, wherein the first metallization layer comprises a first section, a second section, a third section, and a fourth section, wherein the second section horizontally surrounds at least one of the third section or the fourth section; and a first semiconductor body, a second semiconductor body, a third semiconductor body, and a fourth semiconductor body arranged on the first metallization layer, wherein at least one of the first semiconductor body, the second semiconductor body, the third semiconductor body, or the fourth semiconductor body has a first contact pad, a second contact pad, and a third contact pad, wherein:

the third contact pad of the first semiconductor body is electrically coupled to the third section of the first metallization layer via a first electrical connection element, the third contact pad of the second semiconductor body is electrically coupled to the third section of the first metallization layer via a second electrical connection element, the third contact pad of the third semiconductor body is electrically coupled to the fourth section of the first metallization layer via a third electrical connection element, the third contact pad of the fourth semiconductor body is electrically coupled to the fourth section of the first metallization layer via a fourth electrical connection element, and at least one of the first electrical connection element, the second electrical connection element, the third electrical connection element, or the fourth electrical connection element comprises at least one of one or more bonding wires, one or more bonding ribbons, or a connection rail.

8. The semiconductor module arrangement of claim 7, wherein at least one of:

the first semiconductor bodies, the second semiconductor bodies, the third semiconductor bodies, and the fourth semiconductor bodies are identical to each other, or the first and second semiconductor bodies are identical to each other, the third and fourth semiconductor bodies are identical to each other, and the first and second semiconductor bodies differ from the third and fourth semiconductor bodies.

9. The semiconductor module arrangement of claim 7, wherein at least one of the second substrate or the third substrate further comprises:

at least one third terminal element arranged on the third section; and at least one fourth terminal element arranged on the fourth section, wherein a fifth current path between the third contact pad of the first semiconductor body and the at least one third terminal element provides one or more identical voltage and current transfer characteristics as a sixth current path between the third contact pad of the second semiconductor body and the at least one third terminal element, and a seventh current path between the third contact pad of the third semiconductor body and the at least one fourth terminal element provides one or more identical voltage and current transfer characteristics as an eighth current path between the third contact pad of the fourth semiconductor body and the at least one fourth terminal element.

10. The semiconductor module arrangement of claim 7, wherein at least one of the second substrate or the third substrate further comprises a fifth section of the first metallization layer, wherein the second section horizontally surrounds the fifth section, wherein:

the fifth section is electrically coupled to the third section via an electrical connection element, and the fifth section is electrically coupled to the fourth section via an electrical connection element.

11. The semiconductor module arrangement of claim 10, wherein at least one of the second substrate or the third substrate further comprises:

at least one fifth terminal element arranged on the fifth section of the first metallization layer, wherein:

a current path between the at least one fifth terminal element and the third contact pad of the first semiconductor body provides one or more identical voltage and current transfer characteristics as at least one of a current path between the at least one fifth terminal element and the third contact pad of the second semiconductor body, a current path between the at least one fifth terminal element and the third contact pad of the third semiconductor body, or a current path between the at least one fifth terminal element and the third contact pad of the fourth semiconductor body.

12. The semiconductor module arrangement of claim 7, wherein:

the first semiconductor body, the second semiconductor body, the third semiconductor body, and the fourth semiconductor body arranged on the first metallization layer of the second substrate form the fifth controllable semiconductor element, and the first semiconductor body, the second semiconductor body, the third semiconductor body, and the fourth semiconductor body arranged on the first metallization layer of the third substrate form the seventh controllable semiconductor element.

13. The semiconductor module arrangement of claim 7, wherein at least one of the second substrate or the third substrate further comprises:

a sixth section, a seventh section, and an eighth section of the first metallization layer, wherein the first section horizontally surrounds at least one of the seventh section or the eighth section; and a fifth semiconductor body, a sixth semiconductor body, a seventh semiconductor body, and an eighth semiconductor body arranged on the first metallization layer, wherein at least one of the fifth semiconductor body, the sixth semiconductor body, the seventh semiconductor body, or the eighth semiconductor body has a first contact pad, a second contact pad, and a third contact pad, wherein the third contact pad of the fifth semiconductor body is electrically coupled to the seventh section of the first metallization layer via a fifth electrical connection element, the third contact pad of the sixth semiconductor body is electrically coupled to the seventh section of the first metallization layer via a sixth electrical connection element, the third contact pad of the seventh semiconductor body is electrically coupled to the eighth section of the first metallization layer via a seventh electrical connection element, the third contact pad of the eighth semiconductor body is electrically coupled to the eighth section of the first metallization layer via an eighth electrical connection element, and at least one of the fifth electrical connection element, the sixth electrical connection element, the seventh electrical connection element, or the eighth electrical connection element comprises at least one of one or more bonding wires, one or more bonding ribbons, or a connection rail.

14. The semiconductor module arrangement of claim 13, wherein at least one of the second substrate and the third substrate further comprises:

at least one sixth terminal element arranged on the seventh section, and at least one seventh terminal element arranged on the eighth section, wherein a ninth current path between the third contact pad of the fifth semiconductor body and the at least one sixth terminal element provides one or more identical voltage and current transfer characteristics as a tenth current path between the third contact pad of the sixth semiconductor body and the at least one sixth terminal element, and an eleventh current path between the third contact pad of the seventh semiconductor body and the at least one seventh terminal element provides one or more identical voltage and current transfer characteristics as a twelfth current path between the third contact pad of the eighth semiconductor body and the at least one seventh terminal element.

15. The semiconductor module arrangement of claim 1, wherein at least one of:

the first plurality of semiconductor bodies is arranged on the first substrate symmetrically about a first axis of symmetry, or the second plurality of semiconductor bodies is arranged on the second substrate symmetrically about a second axis of symmetry, and the third plurality of semiconductor bodies is arranged on the third substrate symmetrically about a third axis of symmetry.

16. The semiconductor module arrangement of claim 15, wherein the first axis of symmetry, the second axis of symmetry, and the third axis of symmetry are parallel to each other.

17. The semiconductor module arrangement of claim 1, wherein the first substrate, the second substrate and the third substrate are arranged next to each other, with the first substrate arranged in between the second substrate and the third substrate.

18. A semiconductor module arrangement comprising:

a first semiconductor module arrangement according to claim 1; and an identical second semiconductor module arrangement according to claim 1, wherein:

the first semiconductor module arrangement and the second semiconductor module arrangement are arranged next to each other in one plane and symmetrical about an axis of symmetry.

19. A semiconductor module arrangement comprising:

a first substrate with a first plurality of semiconductor bodies arranged thereon;

a second substrate with a second plurality of semiconductor bodies arranged thereon; and a third substrate with a third plurality of semiconductor bodies arranged thereon, wherein:

the first plurality of semiconductor bodies, the second plurality of semiconductor bodies and the third plurality of semiconductor bodies together form a semiconductor arrangement, the semiconductor arrangement comprising a first node and a second node, a layout of the third substrate with the third plurality of semiconductor bodies arranged thereon equals a layout of the second substrate with the second plurality of semiconductor bodies arranged thereon, the first substrate is configured to be connected to the first node and the second node, the second substrate is configured to be connected to a third node, the third substrate is configured to be connected to the third node, a first current path extending between the first node and the third node via the first substrate and the second substrate provides one or more identical voltage and current transfer characteristics as a second current path extending between the first node and the third node via the first substrate and the third substrate, and a third current path extending between the second node and the third node via the first substrate and the second substrate provides one or more identical voltage and current transfer characteristics as a fourth current path extending between the second node and the third node via the first substrate and the third substrate.

20. A semiconductor module arrangement comprising:

a first substrate with a first plurality of semiconductor bodies arranged thereon;

a second substrate with a second plurality of semiconductor bodies arranged thereon; and a third substrate with a third plurality of semiconductor bodies arranged thereon, wherein:

the first plurality of semiconductor bodies, the second plurality of semiconductor bodies and the third plurality of semiconductor bodies together form a semiconductor arrangement, the semiconductor arrangement comprising a first node configured to be operatively coupled to a first electrical potential, and a second node configured to be operatively coupled to a second electrical potential that is different from the first electrical potential, the first substrate is configured to be connected to the first node and the second node, the second substrate is configured to be connected to a third node, the third substrate is configured to be connected to the third node, a first current path extending between the first node and the third node via the first substrate and the second substrate provides one or more identical voltage and current transfer characteristics as a second current path extending between the first node and the third node via the first substrate and the third substrate, and a third current path extending between the second node and the third node via the first substrate and the second substrate provides one or more identical voltage and current transfer characteristics as a fourth current path extending between the second node and the third node via the first substrate and the third substrate.

* * * * *